(12) United States Patent
Zhan et al.

(10) Patent No.: US 10,382,870 B2
(45) Date of Patent: Aug. 13, 2019

(54) PIEZOELECTRIC MICROPHONE

(71) Applicant: Goertek Inc., Shandong (CN)

(72) Inventors: Junkai Zhan, Shandong (CN); Zonglin Zhou, Shandong (CN); Mengjin Cai, Shandong (CN)

(73) Assignee: Goertek Inc., Shandong (CN)

( * ) Notice: Subject to any disclaimer, the term of this patent is extended or adjusted under 35 U.S.C. 154(b) by 101 days.

(21) Appl. No.: 15/739,935

(22) PCT Filed: Aug. 29, 2017

(86) PCT No.: PCT/CN2017/099519
§ 371 (c)(1),
(2) Date: Dec. 26, 2017

(87) PCT Pub. No.: WO2018/214321
PCT Pub. Date: Nov. 29, 2018

(65) Prior Publication Data
US 2019/0052974 A1 Feb. 14, 2019

(30) Foreign Application Priority Data
May 22, 2017 (CN) .......................... 2017 1 0364823

(51) Int. Cl.
*H04R 17/02* (2006.01)
*H04R 19/04* (2006.01)
*H01L 41/083* (2006.01)

(52) U.S. Cl.
CPC ............ *H04R 17/02* (2013.01); *H04R 19/04* (2013.01); *H01L 41/083* (2013.01); *H04R 2201/003* (2013.01)

(58) Field of Classification Search
USPC .... 381/26, 91, 111, 114, 173, 174, 175, 190
See application file for complete search history.

(56) References Cited

U.S. PATENT DOCUMENTS

| 5,889,352 A | 3/1999 | Takeuchi et al. |
| 2002/0070639 A1* | 6/2002 | Yamaguchi ........... B81C 1/0038 310/330 |
| 2010/0156238 A1* | 6/2010 | Kim ....................... H04R 17/00 310/322 |

FOREIGN PATENT DOCUMENTS

| CN | 102545827 A | 7/2012 |
| CN | 104202010 A | 12/2014 |

(Continued)

OTHER PUBLICATIONS

International Searching Authority, International Search Report (ISR) and Written Opinion for International Application No. PCT/CN2017/099519, dated Dec. 27, 2017, 10 pages, State Intellectual Property Office of the People's Republic of China, China.

*Primary Examiner* — Yosef K Laekemariam
(74) *Attorney, Agent, or Firm* — Alston & Bird LLP

(57) ABSTRACT

The present invention discloses a piezoelectric microphone. The piezoelectric microphone comprises a substrate having a cavity-backed, and a piezoelectric film connected to the upper side of the substrate via an insulating layer. A position on the piezoelectric film, which is located at the inner side of a junction of the piezoelectric film and the substrate, is provided with a plurality of hollowed-out holes. The hollowed-out holes in the piezoelectric film are at least partly overlapped with the substrate. A gap is provided between the substrate and the position, where the hollowed-out holes are located, on the piezoelectric film. The gap and the hollowed-out holes a together form a channel. Compared with the traditional hollowed-out structure, the gap of the present invention can hinder the sound from directly spreading via the hollowed-out holes, thereby greatly reducing the amount of leakage of low-and-intermediate frequency signals of the piezoelectric microphone and improving the performance of the piezoelectric microphone. In addition, the gap can also (Continued)

effectively prevent a chip from being damaged by the invasion of dust, particles and water.

10 Claims, 2 Drawing Sheets

(56) References Cited

FOREIGN PATENT DOCUMENTS

| | | |
|---|---|---|
| CN | 206164826 U | 5/2017 |
| CN | 107071672 A | 8/2017 |

* cited by examiner

PIEZOELECTRIC MICROPHONE

CROSS REFERENCE TO RELATED APPLICATIONS

This application is a national stage application, filed under 35 U.S.C. § 371, of International Application No. PCT/CN2017/099519, filed Aug. 29, 2017, which claims priority to Chinese Application No. 201710364823.6, filed May 22, 2017, the contents of both which as are hereby incorporated by reference in their entirety.

BACKGROUND

Technical Field

The present invention relates to the field of microphones, and in particular, to a piezoelectric microphone.

Description of Related Art

MEMS microphones are now widely applied and popularized in consumer electronics. The traditional MEMS microphone is mainly a capacitive microphone and comprises a substrate, and a back electrode and a vibration diaphragm formed on the substrate. The vibration diaphragm and the back electrode form a capacitor structure. With this double-film design, the air damping problem between the back electrode and the vibration diaphragm cannot be avoided, so its SNR parameters stay at a 65 dB level. Subsequent performance upgrade of the MEMS capacitive microphone must rely on the breakthroughs in material technology and design architecture.

With the development of science and technology, piezoelectric silicon microphones are gradually developed, and the production process of the piezoelectric microphones is simple. Due to the single-film design architecture, they are not limited by air damping, and their SNRs naturally increase. In addition, because of a simple structure of the piezoelectric silicon microphone, the anti-fouling, dust-proof, waterproof and other environmental adaptabilities thereof have also been greatly enhanced. In recent years, with the breakthrough of AlN and PZT materials, the piezoelectric MEMS microphone will become the development mainstream of a new generation MEMS microphone.

However, compared to the capacitive microphone, the piezoelectric microphone is affected in popularization and application with the biggest disadvantage of its low sensitivity. In other words, the ability of a piezoelectric film to sense an audio signal is much lower than that of the vibration diaphragm in the capacitive microphone. In order to enhance the sensitivity of the piezoelectric microphone, most manufacturers use a hollowed-out design for the piezoelectric film. However, this hollowed-out design causes serious leakage of low-frequency signals and even intermediate-frequency signals, and also reduces the effective area of the piezoelectric film, so that sound signals cannot be effectively received. As a result, there is a great gap between product performance and theoretical data, and therefore, the expected performance cannot be achieved.

BRIEF SUMMARY

An objective of the present invention is to provide a novel technical solution for a piezoelectric microphone.

According to the first aspect of the present invention, there is provided a piezoelectric microphone. The piezoelectric microphone comprises a substrate having a cavity-backed, and a piezoelectric film connected to the upper side of the substrate via an insulating layer. A position on the piezoelectric film, which is located at the inner side of a junction of the piezoelectric film and the substrate, is provided with a plurality of hollowed-out holes. The hollowed-out holes in the piezoelectric film are at least partly overlapped with the substrate. A gap is provided between the substrate and the position, where the hollowed-out holes are located, on the piezoelectric film. The gap and the hollowed-out holes together form a channel.

Optionally, the plurality of hollowed-out holes is distributed around the cavity-backed of the substrate.

Optionally, the insulating layer between the substrate and the piezoelectric film is of a continuous ring structure.

Optionally, the insulating layer between the substrate and the piezoelectric film is of a discontinuous ring structure.

Optionally, the hollowed-out holes penetrate to the edge of the piezoelectric film and are distributed between two discontinuous insulating layers in an opposing manner.

Optionally, a portion on the piezoelectric film from the hollowed-out holes to the center of the piezoelectric film is overlapped with the substrate.

Optionally, the gap between the piezoelectric film and the substrate is 0.5 um to 3 um.

Optionally, the hollowed-out holes are circular, rectangular, oval, fan-shaped or trapezoidal.

Optionally, the piezoelectric film sequentially comprises a first electrode layer, a piezoelectric intermediate layer and a second electrode layer which are combined together.

Optionally, the first electrode layer, the piezoelectric intermediate layer and the second electrode layer are combined together by way of deposition.

According to the piezoelectric microphone applicable to the sound sources at two sides provided by the present invention, the hollowed-out holes can form the channel that communicates the two sides of the piezoelectric film, only through the gap, such that normal sound can only circulate through the gap. Compared with the traditional hollowed-out structure, the gap of the present invention can hinder the sound from directly spreading via the hollowed-out holes, thereby greatly reducing the amount of leakage of low-and-intermediate frequency signals of the piezoelectric microphone, and improving the performance of the piezoelectric microphone. In addition, the gap can also effectively prevent a chip from being damaged by the invasion of dust, particles and water.

The inventor of the present invention has found that, in the prior art, the hollowed-out structure arranged on the piezoelectric film causes serious leakage of low-frequency signals, even intermediate frequency signals and also reduces the effective area of the piezoelectric film, so that sound signals cannot be effectively received; there is a great gap between product performance and theoretical data; and therefore, the expected performance cannot be achieved. Therefore, the technical task to be achieved by the present invention or the technical problem to be solved by the present invention is not thought of or anticipated by those skilled in the art, and accordingly, the present invention is a novel technical solution.

Other features and advantages of the present invention will become apparent from the following detailed description of exemplary embodiments of the present invention with reference to the accompanying drawings.

BRIEF DESCRIPTION OF THE FIGURES

The accompanying drawings, which are incorporated in and constitute a part of the description, illustrate embodiments of the present invention and, together with the description thereof, serve to explain the principles of the present invention.

DETAILED DESCRIPTION OF VARIOUS EMBODIMENTS

Figure 1:
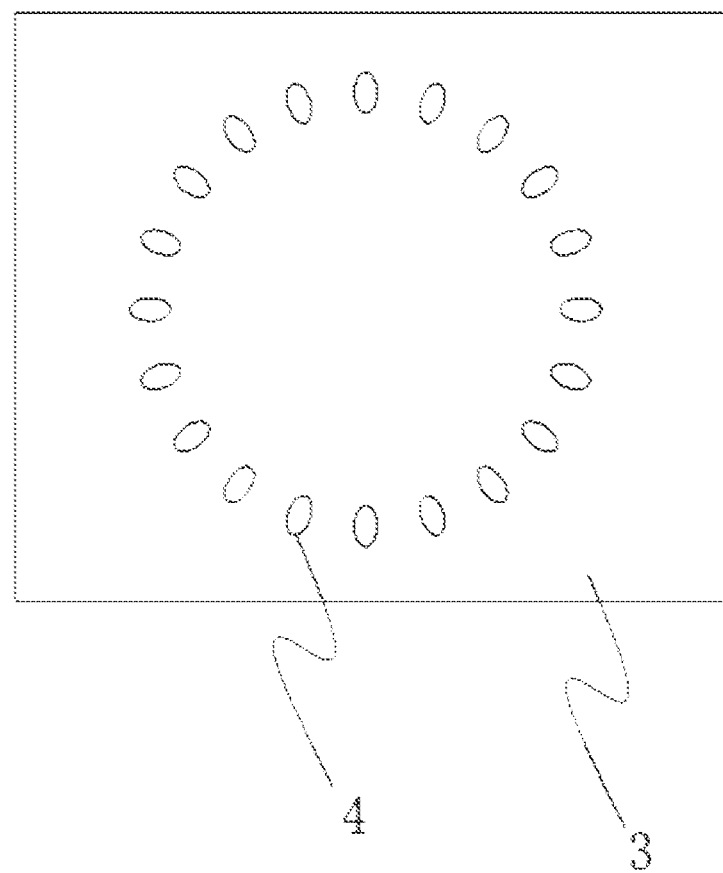
FIG. 1 is a top view of a piezoelectric film of the present invention.

Various exemplary embodiments of the present invention will now be described in detail with reference to the accompanying drawings. It should be noted that the relative arrangement, numerical expressions and numerical values of the components and steps set forth in these embodiments do not limit the scope of the present invention unless otherwise specified.

The following description of at least one exemplary embodiment is in fact merely illustrative and is in no way intended as a limitation to the present invention and its application or use.

Techniques, methods, and devices known to those of ordinary skill in the relevant art may not be discussed in detail but where appropriate, the techniques, methods, and devices should be considered as part of the description.

Among all the examples shown and discussed herein, any specific value should be construed as merely illustrative and not as a limitation. Thus, other examples of exemplary embodiments may have different values.

It should be noted that similar reference numerals and letters denote similar items in the accompanying drawings, and therefore, once an item is defined in a drawing, there is no need for further discussion in the accompanying drawings.

Figure 2:
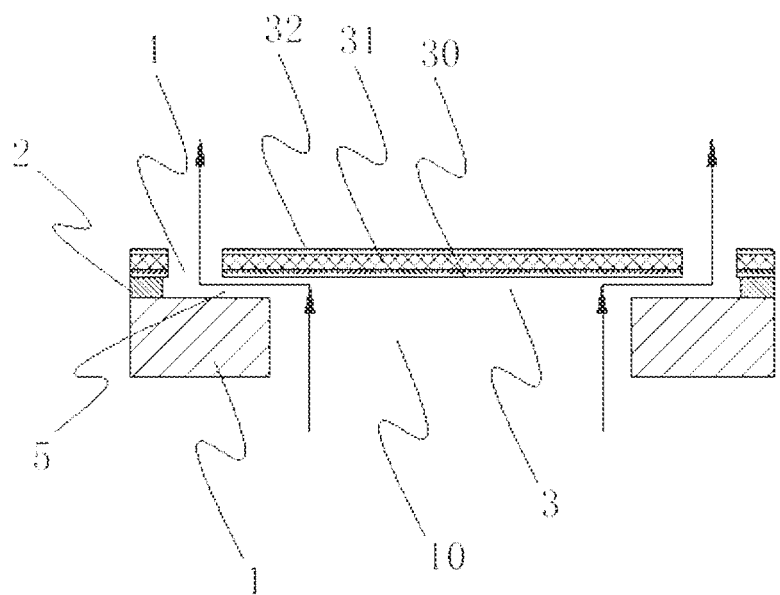
FIG. 2 is a schematic drawing of a lower sound source of a microphone of the present invention.

Referring to FIG. 1 to FIG. 2, the present invention provides a piezoelectric microphone. The piezoelectric microphone comprises a substrate 1, and a piezoelectric film 3 connected to the upper side of the substrate 1 via an insulating layer 2. A cavity-backed 10 is formed in a central region of the substrate 1. The edge of the piezoelectric film 3 is supported above the substrate 1 via the insulating layer 2, such that the insulation between the piezoelectric film 3 and the substrate 1 is ensured, and other regions of the piezoelectric film 3 except for the edge connection position is suspended above the cavity-backed 10 of the substrate 1.

The microphone of the present invention may be manufactured by an MEMS process. The substrate 1 may be made of single crystal silicon. The insulating layer 2 may be made of silicon dioxide. The piezoelectric film 3 may be made of AlN or PZT. In a specific embodiment of the present invention, the piezoelectric film 3 sequentially comprises a first electrode layer 30, a piezoelectric intermediate layer 31 and a second electrode layer 32 which are combined together. Such combination may be achieved by sequential deposition in the MEMS process, or may be performed by other means well known in the art of piezoelectric materials and will not be described in detail herein.

The shape of the piezoelectric film 3 of the present invention is matched with that of the substrate 1, which may be circular, rectangular or other shapes well known to those skilled in the art. The piezoelectric film 3 is provided with a plurality of hollowed-out holes 4 located at the inner side of a junction of the piezoelectric film 3 and the substrate 1. That is to say, the edge of the piezoelectric film 3 is supported at and connected to the upper side of the substrate 1 via the insulating layer 2, and the hollowed-out holes 4 are provided in a vibration region of the piezoelectric film 3, such that the hollowed-out holes 4 may improve the sensitivity of the piezoelectric film 3.

The hollowed-out holes 4 in the piezoelectric film 3 are at least partly overlapped with the substrate 1. Referring to FIG. 2, the hollowed-out holes 4 in the piezoelectric film 3 are least partly located right above the substrate 1, such that a gap 5 is provided between the substrate 1 and the position, where the hollowed-out holes 4 are located, on the piezoelectric film 3. That is to say, there is no insulating layer 2 between the substrate 1 and the position, where the hollowed-out holes 4 are located, on the piezoelectric film 3, such that the position, where the hollowed-out holes 4 are located, on the piezoelectric film 3, are suspended right above the substrate 1. The gap 5 and the hollowed-out holes 4 together form a channel that communicates the cavity-backed 10 and the upper side of the piezoelectric film 3.

According to the piezoelectric microphone of the present invention, the hollowed-out holes can form the channel that communicates the two sides of the piezoelectric film, only through the gap, such that normal sound can only circulate through the gap. Compared with the traditional hollowed-out structure, the gap of the present invention can hinder the sound from directly spreading via the hollowed-out holes, thereby greatly reducing the amount of leakage of low-and-intermediate frequency signals of the piezoelectric microphone and improving the performance of the piezoelectric microphone. In addition, the gap can also effectively prevent a chip from being damaged by the invasion of dust, particles and water.

Figure 3:
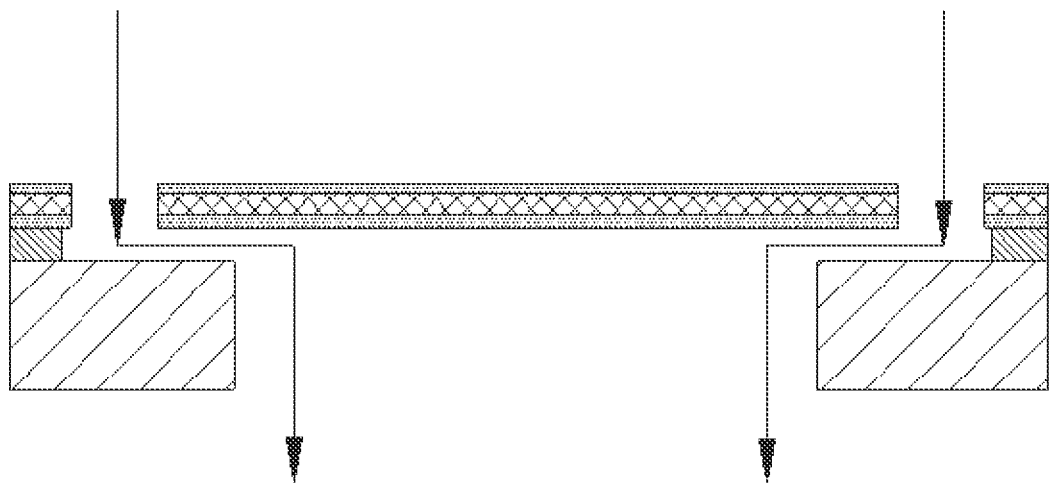
FIG. 3 is a schematic drawing of an upper sound source of a microphone of the present invention.

Referring to FIG. 2 and FIG. 3, the piezoelectric microphone of the present invention can be applied to both an upper sound source and a lower sound source. FIG. 2 illustrates the schematic drawing of the lower sound source, wherein the sound enters from the lower side of the cavity-backed 10, and at this time the gap 5 can reduce the leakage of low-and-intermediate frequency signals from the hollowed-out holes 4. FIG. 3 illustrates a schematic drawing of the upper sound source, wherein when the sound enters into the gap 5 from the upper side of the piezoelectric film 3 via the hollowed-out holes 4, the gap 5 can also hinder the leakage of low-and-intermediate frequency signals.

According to the piezoelectric microphone of the present invention, since the hollowed-out holes 4 are distributed at the outer side of the cavity-backed 10 in an opposing manner, it is possible to control and adjust the leakage amount of sound pressure. For example, the length and the height of the gap 5 may be controlled so as to adjust the hindrance ability of the gap 5.

For example, in a specific embodiment of the present invention, the height of the gap 5 may be, for example, 0.5 um to 3 um.

In another specific embodiment of the present invention, the hollowed-out holes 4 in the piezoelectric film 3 may be partly or totally overlapped with the substrate 1, thereby adjusting a lateral dimension of the gap 5. Further optionally, a portion on the piezoelectric film 3 from the hollowed-out holes 4 to the center of the piezoelectric film 3 is overlapped with the substrate 1. That is to say, not only is the position where the hollowed-out holes 4 are located totally overlapped with the substrate 1, but the region on the piezoelectric film 3 from the hollowed-out holes 4 to the center of the piezoelectric film 3 partly extends to a position just above the substrate 1 and participates in the formation of the gap 5. Therefore, the lateral dimension of the gap 5 is greatly extended, and the hindrance ability of the gap 5 is improved. In addition, the longer gap 5 can also effectively prevent dust particles from invading into the interior of a chip.

Figure 4:
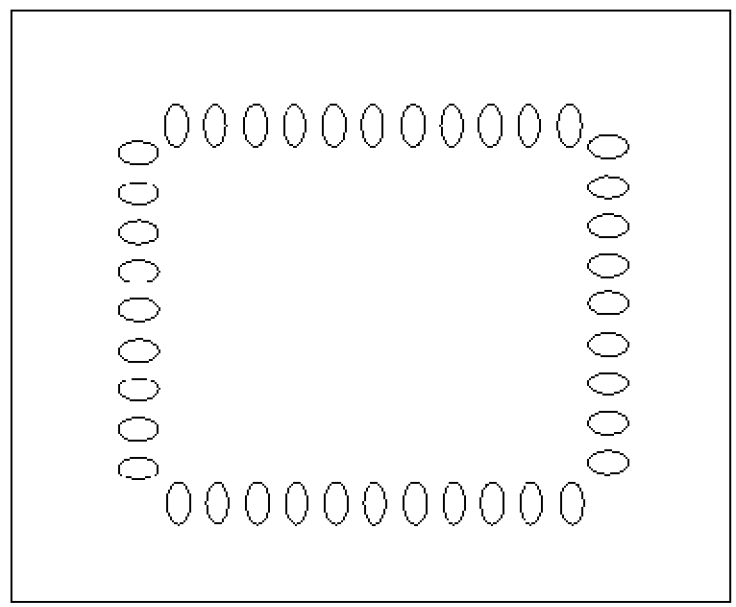
FIG. 4 is a top view of another embodiment of the piezoelectric film of the present invention.

The plurality of hollowed-out holes 4 of the present invention is uniformly arranged around the cavity-backed 10 of the substrate 1. The plurality of hollowed-out holes 4 may be, for example, arranged in a circular ring structure as shown in FIG. 1, or in a rectangular ring structure as shown in FIG. 4. The hollowed-out holes 4 may be circular, rectangular, oval, fan-shaped, trapezoidal, or the like. The insulating layer 2 between the substrate 1 and the piezoelectric film 3 may be of a continuous ring shape or a discontinuous ring structure.

When the insulating layer 2 between the substrate 1 and the piezoelectric film 3 is of the continuous ring structure, that is, the insulating layer 2 is in a closed ring shape, the substrate 1 and the piezoelectric film 3 are both closed by the insulating layer 2 in a circumferential direction. At this moment only a channel formed by the gap 5 and the hollowed-out holes 4 is present.

When the insulating layer 2 between the substrate 1 and the piezoelectric film 3 is of the discontinuous ring structure, a plurality of channels may be formed among the gap 5, the two discontinuous insulating layers 2 and the hollowed-out holes 4. This structure will increase the leakage amount of the microphone with respect to the case of only one channel as described above.

The hollowed-out holes 4 of the present invention may be formed inside the piezoelectric film 3. Correspondingly, the hollowed-out holes 4 may also penetrate to the edge of the piezoelectric film 3. In this case, the hollowed-out holes 4 may be distributed in positions between the two discontinuous insulating layers 2 in an opposing manner to prevent the insulating layer 2 from contacting the hollowed-out holes 4 and ensure that the effect of the hollowed-out holes 4 to improve the sensitivity of the piezoelectric film 3 cannot be affected.

While certain specific embodiments of the present invention have been illustrated by way of example, it will be understood by those skilled in the art that the foregoing examples are provided for the purpose of illustration and are not intended to limit the scope of the present invention. It will be understood by those skilled in the art that the foregoing embodiments may be modified without departing from the scope and spirit of the present invention. The scope of the present invention is subject to the attached claims.

What is claimed is:

1. A piezoelectric microphone, comprising:
a substrate having a cavity-backed; and
a piezoelectric film connected to the upper side of the substrate via an insulating layer, wherein:
a position on the piezoelectric film, which is located at the inner side of a junction of the piezoelectric film and the substrate, is provided with a plurality of hollowed-out holes;
the hollowed-out holes in the piezoelectric film are at least partly overlapped with the substrate;
a gap is provided between the substrate and the position, where the hollowed-out holes are located, on the piezoelectric film; and
the gap and the hollowed-out holes together form a channel.

2. The piezoelectric microphone according to claim 1, wherein the plurality of hollowed-out holes is distributed around the cavity-back of the substrate.

3. The piezoelectric microphone according to claim 1, wherein the insulating layer between the substrate and the piezoelectric film is of a continuous ring structure.

4. The piezoelectric microphone according to claim 1, wherein the insulating layer between the substrate and the piezoelectric film is of a discontinuous ring structure.

5. The piezoelectric microphone according to claim 4, wherein the hollowed-out holes penetrate to the edge of the piezoelectric film and are distributed between two discontinuous insulating layers in an opposing manner.

6. The piezoelectric microphone according to claim 1, wherein a portion on the piezoelectric film from the hollowed-out holes to the center of the piezoelectric film is overlapped with the substrate.

7. The piezoelectric microphone according to claim 1, wherein the gap between the piezoelectric film and the substrate is 0.5 um to 3 um.

8. The piezoelectric microphone according to claim 1, wherein the hollowed-out holes are circular, rectangular, oval, fan-shaped or trapezoidal.

9. The piezoelectric microphone according to claim 1, wherein the piezoelectric film sequentially comprises a first electrode layer, a piezoelectric intermediate layer and a second electrode layer which are combined together.

10. The piezoelectric microphone according to claim 9, wherein the first electrode layer, the piezoelectric intermediate layer and the second electrode layer are combined together by way of deposition.

* * * * *